(12) United States Patent
Young et al.

(10) Patent No.: US 6,859,359 B2
(45) Date of Patent: Feb. 22, 2005

(54) MODULAR SENSOR PLATFORM

(75) Inventors: Stuart Young, Burke, VA (US); Richard R. Gregory, Jr., Mount Airy, MD (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 14 days.

(21) Appl. No.: 10/058,325

(22) Filed: Jan. 30, 2002

(65) Prior Publication Data

US 2003/0141837 A1 Jul. 31, 2003

(51) Int. Cl.$^7$ ................................................ H05K 7/20
(52) U.S. Cl. ..................... 361/683; 361/679; 361/695; 361/724; 312/223.1; 312/223.2; 367/120; 367/128
(58) Field of Search ................................. 361/679, 724, 361/728, 816; 15/319–320, 302, 317; 312/223.1–223.3; 367/120, 128, 124, 127, 129; 700/245, 258, 259, 264; 701/28, 41, 50, 213, 214, 215, 300, 207, 217, 220; 901/47; 446/175

(56) References Cited

U.S. PATENT DOCUMENTS

| | | | | |
|---|---|---|---|---|
| 5,056,331 A | * | 10/1991 | Lotz | 62/237 |
| 5,168,171 A | * | 12/1992 | Tracewell | 307/64 |
| 5,341,540 A | * | 8/1994 | Soupert et al. | 15/319 |
| 5,491,670 A | * | 2/1996 | Weber | 367/127 |
| 5,940,346 A | * | 8/1999 | Sadowsky et al. | 367/128 |
| D413,551 S | * | 9/1999 | Wilcox et al. | D12/1 |
| 6,336,544 B1 | * | 1/2002 | Blad et al. | 194/217 |
| 6,671,582 B1 | * | 12/2003 | Hanley | 700/245 |
| 6,687,571 B1 | * | 2/2004 | Byrne et al. | 700/245 |

* cited by examiner

Primary Examiner—Michael Datskovsky
(74) Attorney, Agent, or Firm—William V. Adams

(57) ABSTRACT

Robot and remote controlled devices have been utilized for information gathering purposes. However these robotic vehicles lack efficiency because they are not capable of operating out of doors or where the sensors and apparatus located on the robots are subject to harsh environments.

The present invention provides a new and unique manner of overcoming these problems by providing a platform system that is placed upon existing robots without requiring adjustments to these devices. The platform effectuates easy installation of a plurality of sensors and apparatus on its top surface while providing internal housing for its wires and components, thereby providing a water, dirt and dust resistant environment which leads to better equipment function and ease of maintenance and repair.

19 Claims, 12 Drawing Sheets

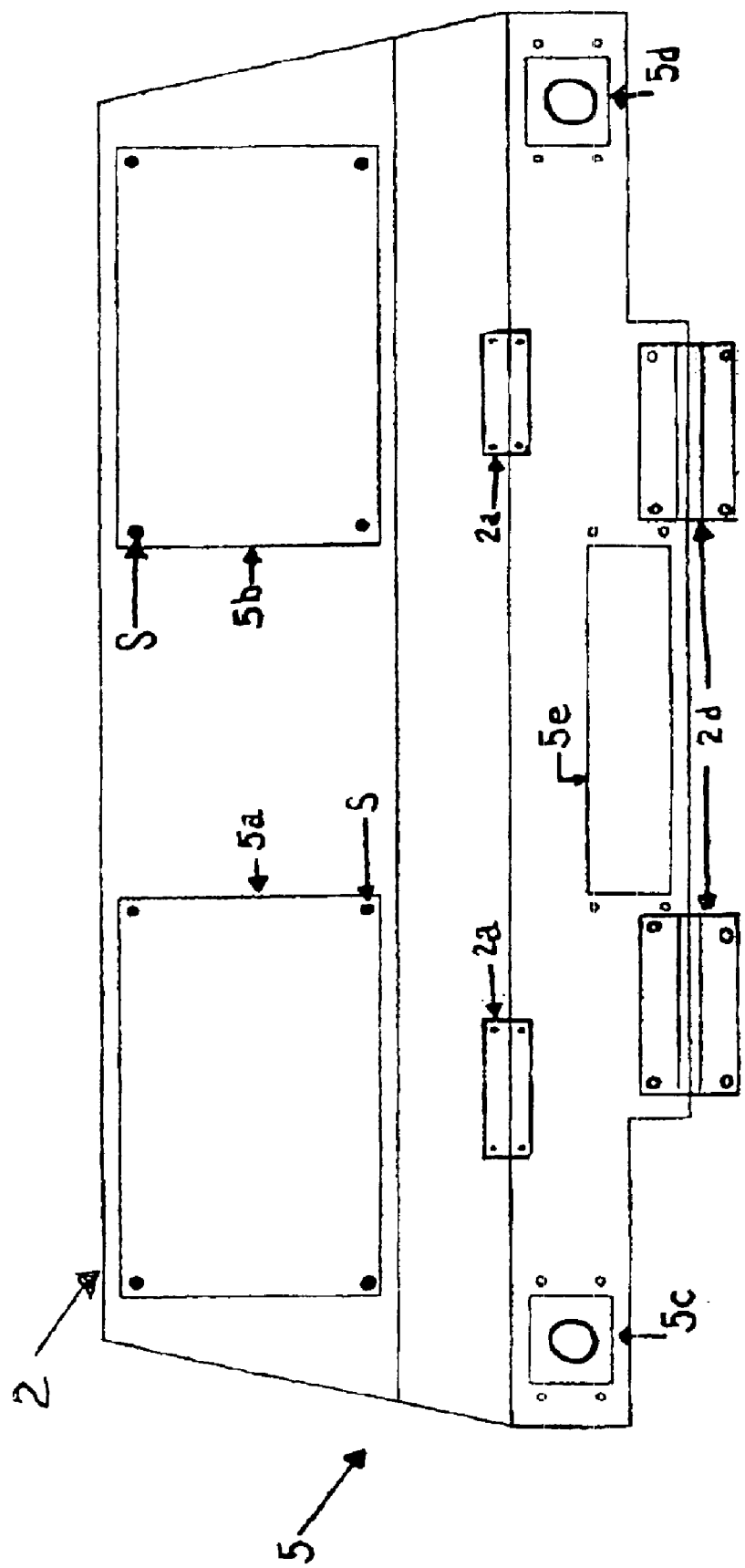

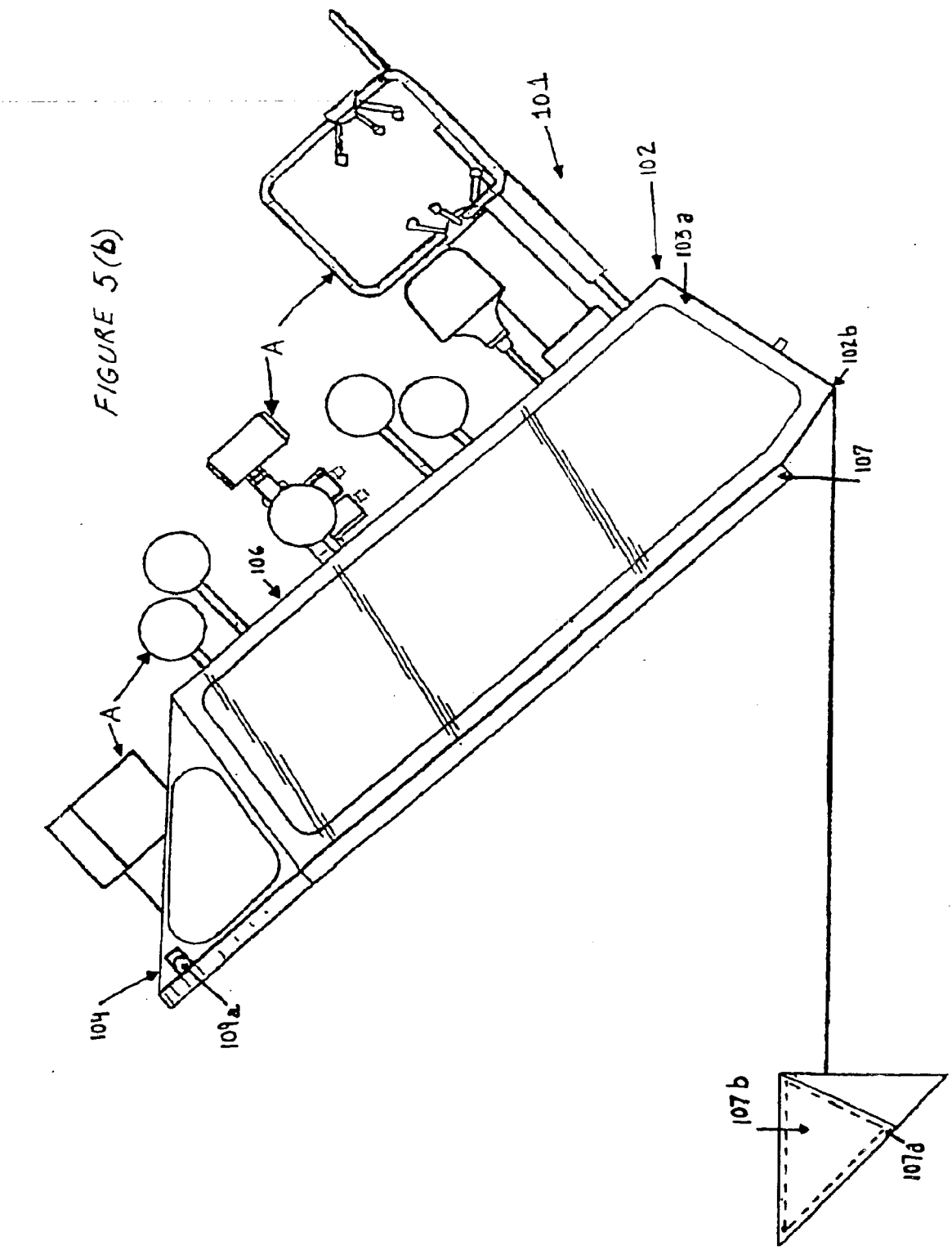

MODULAR SENSOR PLATFORM

STATEMENT OF GOVERNMENT INTEREST

The invention described herein may be manufactured, used and/or licensed by or for the United States Government.

BACKGROUND OF THE INVENTION

Robotic agents will be ubiquitous on future battlefields, principally to lower the exposure of harm to ground forces. Teams of small collaborating robotic agents, having advanced sensor and mobility characteristics, can be utilized to conduct tasks such as reconnaissance and surveillance, chemical and biological agent detection, logistics, and communications relay. These robotic agents can also be utilized to operate in hostile environments or adverse weather conditions outside of armed forces applications.

Present robotic agents are generally not designed to be used in harsh environments. Current robotic endeavors utilize state of the art components attached to the top of a base with component interfaces and connections (wires) exposed. Additionally, these components are permanently affixed to the base, or embedded into the system, requiring a great deal of time and effort to remove and replace in case of equipment malfunction or system upgrade.

The overall configuration of these robotic agents is not designed to be modular, thereby precluding the use of rapid change components due to replacement due to failure or task changes. Specifically, prior art robotic agents are not water resistant, thermally protected or protected from dust or dirt. Since these agents typically carry sensitive sensors and devices, their lack of protective elements limit their application.

SUMMARY OF THE INVENTION

The present invention overcomes the difficulties of known robotic agents by providing a system which allows the robotic agents unlimited applications in all types of weather and environmental conditions. Furthermore, the present invention provides multiple changes of modular components, thereby providing quick removal of inoperative or damaged parts, as well as allowing for customizing a basic agent for particular use.

It is, therefore, an objective of the present invention to provide a platform system that is quickly attached to vehicular device having a drive train and power supply, where the platform system provides remote data acquisition and transmission.

It is also an objective of the present invention to provide a system for rapid removal, reconfiguration and exchange of components that is easily manipulated and capable of housing a variety of components necessary for information gathering and transmission applications in a wide variety of environmental and weather conditions.

It is also an objective of the present invention to provide a platform system that is capable of being quickly opened so as to allow quick repair, removal, maintenance or upgrade of all apparatus and sensors, all components housed within the platform interior and track all wires connected to each of the apparatus, sensors and components.

It is also an objective of the present invention to provide a platform system that is capable of being opened in a second position to allow direct access to all portions of the robotic components.

It is also an objective of the present invention to provide removable side panels that allow an alternative means of accessing the interiorly housed components and wires as well as effectuating rapid removal of all apparatus, sensors, components and wires.

These and other objectives have led to the present invention discussed below.

DESCRIPTION OF THE FIGURES

FIG. 3d shows a rear view of the platform system of the present invention.

FIG. 5b shows an alternate position of the alternate embodiment of the platform system of the present invention.

DETAILED DESCRIPTION OF THE EMBODIMENTS

The present invention is directed to a platform system that provides a new and unique manner for housing a plurality of apparatus and sensors storing their respective components and related hardware such that they are rapidly exchangeable, water resistant and capable of operating in a wide range of environmental and weather conditions. The platform system of the present invention is capable of operating as a stationary unit or may be placed upon vehicles having existing robotic units. The modular platform system is capable of accommodating a wide variety of sensors and apparatus for remote data recording, imaging and transmission.

Figure 1:
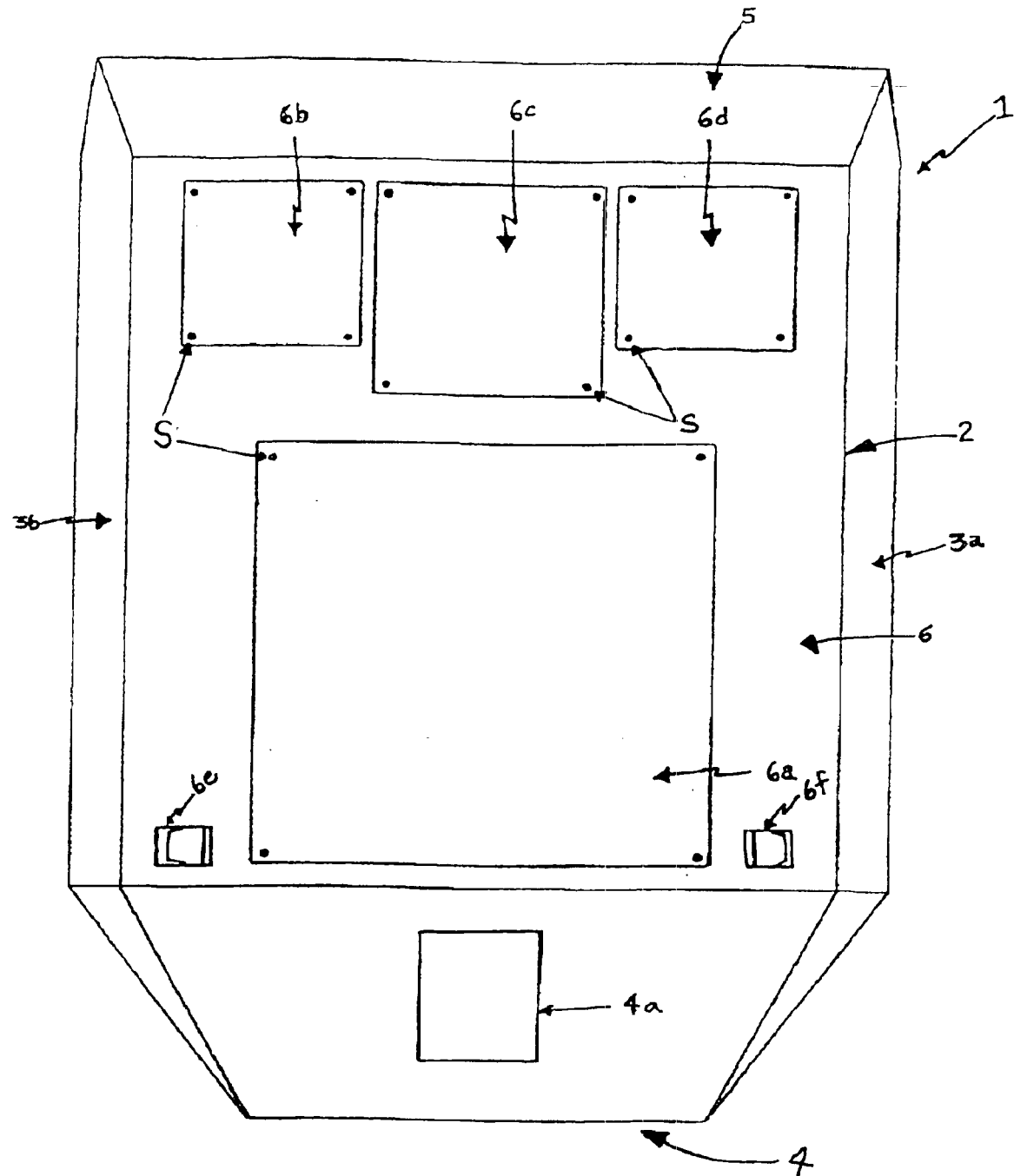
FIG. 1 shows a top view of the platform system of the present invention.

As shown in FIG. 1, the platform system 1 includes an upper portion 2, a first side 3a, a second side 3b, a front portion 4 and a back portion 5. The upper portion 2 also includes an outer top surface 6.

The outer top surface 6, of the platform system 1, includes a plurality of plates 6a, 6b, 6c and 6d that are screwed onto the top surface 6 with screws S. The plurality of plates 6a, 6b, 6c and 6d are capable of housing several apparatus and sensors, including but not limited to an 8-microphone acoustic array, a visible camera, an infrared camera, a scanning laser rangefinder (LADAR), a point laser rangefinder, 12 sonar sensors, 3 CPUs, 2 wireless LANS, a video transmitter, a GPS sensor, a digital compass, a weather sensor, a stereo camera pair and a driving camera. Additional or alternate plates may be added to the top surface 6 depending upon the number and type of apparatus utilized. Top surface 6 also includes rapid release latch mechanisms 6e and 6f that effectuate quick release and closure of upper portion 2.

Figure 2:
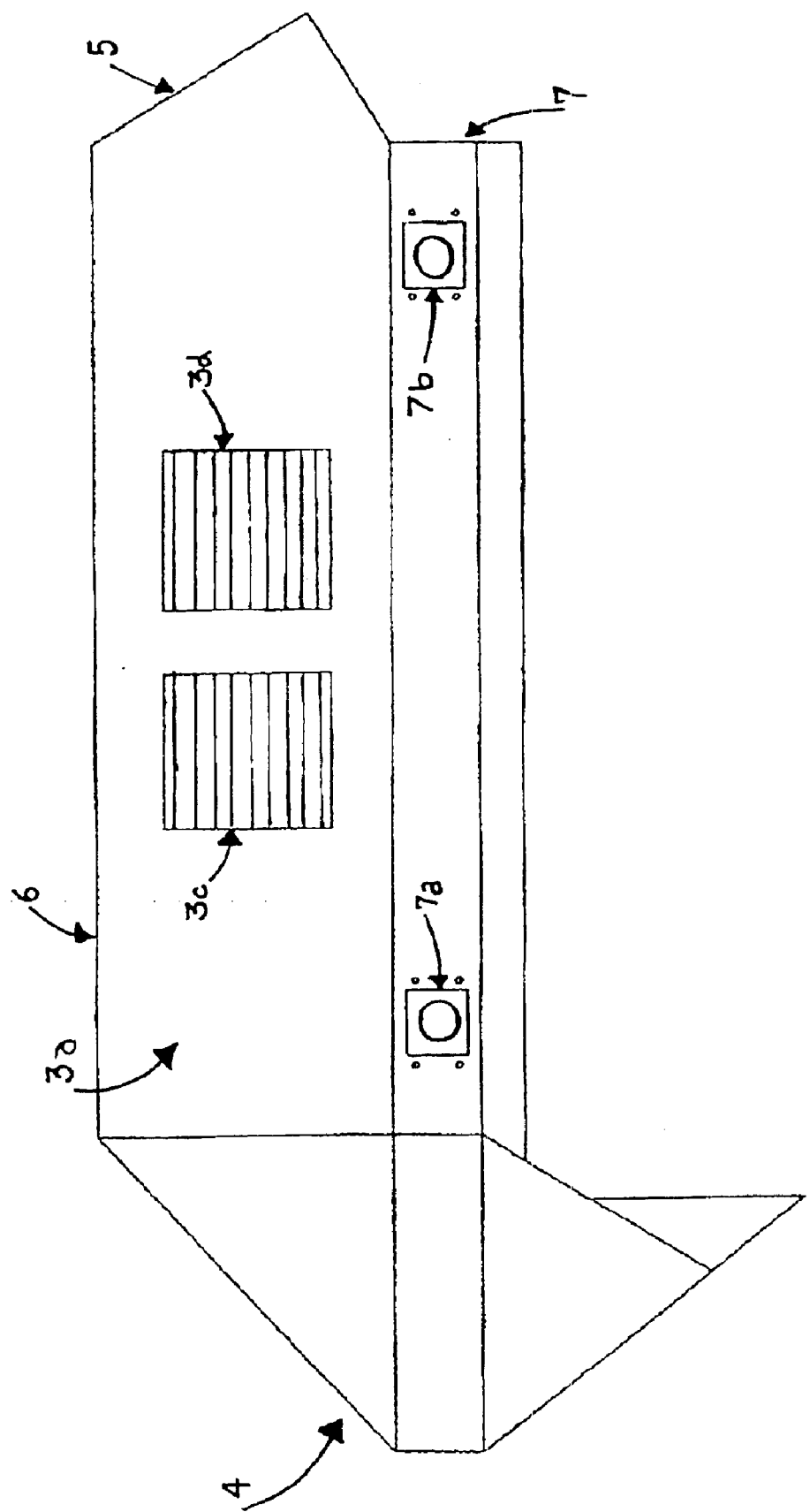
FIG. 2 shows a side view of the platform system of the present invention.

The left side view of the platform system 1, as shown in FIG. 2, shows a first side 3a, having air flow apparatus 3c and 3d, front portion 4 and back portion 5. Air flow apparatus 3c and 3d include filters, fans and vents that provide necessary air flow to prevent components and wiring of apparatus and sensors positioned on surface 6, from overheating. The platform system 1 also includes a base portion 7 with sonar sensors 7a and 7b. Similarly, second side 3b includes vents 3e and 3f and sonar sensors 7c and 7d (not shown).

Figure 3A:
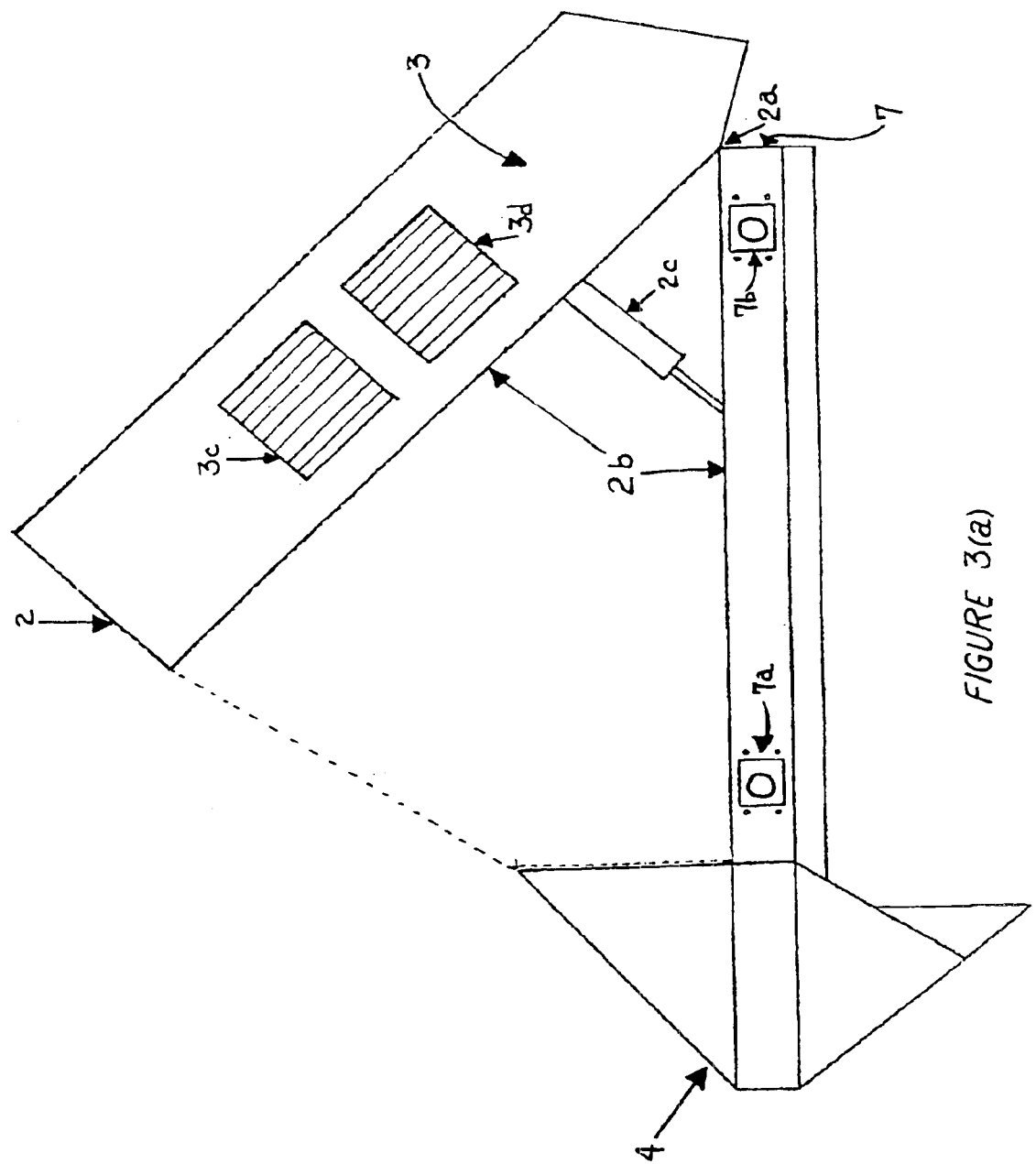
FIG. 3a shows an alternate system access position of the platform system of the present invention.

FIG. 3(a) shows a preferred embodiment of the present invention. Upper portion 2 is hinged with quick-release hinges 2a to allow upper portion 2 to be lifted away from front portion 4 and base portion 7 and provide access to interior portion 2b. To maintain the upper portion 2 at an open position as shown in FIG. 3(a), a pair of gas-charged lift supports 2c (proximate to side 3a) and 2d (proximate to side 3b and not shown) control the rate of ascent to the completed open position. Similarly, gas-charged lift supports 2c and 2d also control the rate of descent to prevent inadvertent closing.

Figure 3B:
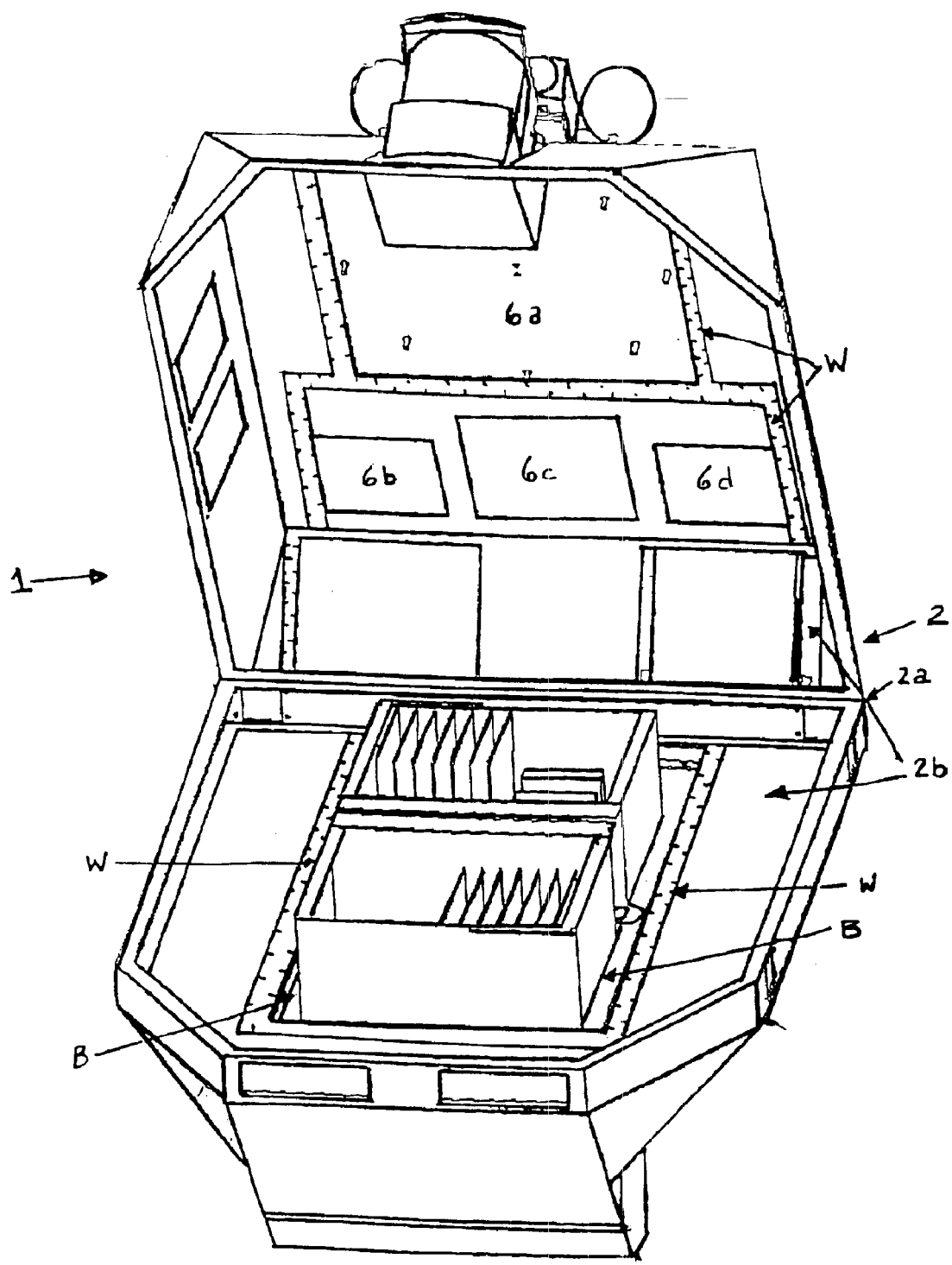
FIG. 3b shows an interior configuration of the platform system of the present invention.

As shown in FIG. 3(b), the hinges 2a allow the interior portion 2b to be accessed. The interior portion 2b of upper portion 2 serves as a housing for wires connecting the devices to their respective power sources and the like. In particular, interior portion 2b provides a wire housing system W that is used to maintain wire integrity between each apparatus and sensor and their respective components. The wire housing system W effectuates an efficient and rapid manner by which each apparatus' wiring can be easily tracked and identified for rapid maintenance and/or removal. Additionally, wire housing system W also insulates the wiring from sudden jolts and vibrations when the system 1 is in motion. Interior portion 2b also includes a plurality of brackets B for holding individual components of the devices positioned on surface 6 (the interior portions of panels 6a, 6b, 6c and 6d, as shown). The brackets B provide additional stability, shock and vibration isolation that prevent sudden jolts and vibration from reaching the components when system 1 is in motion. Note that the positions of the wire housing system W and the brackets B are generally shown in FIG. 3(b). Exact positioning of these elements will be dependant upon design and functional parameters as understood by one of ordinary skill in the art.

Figure 3C:
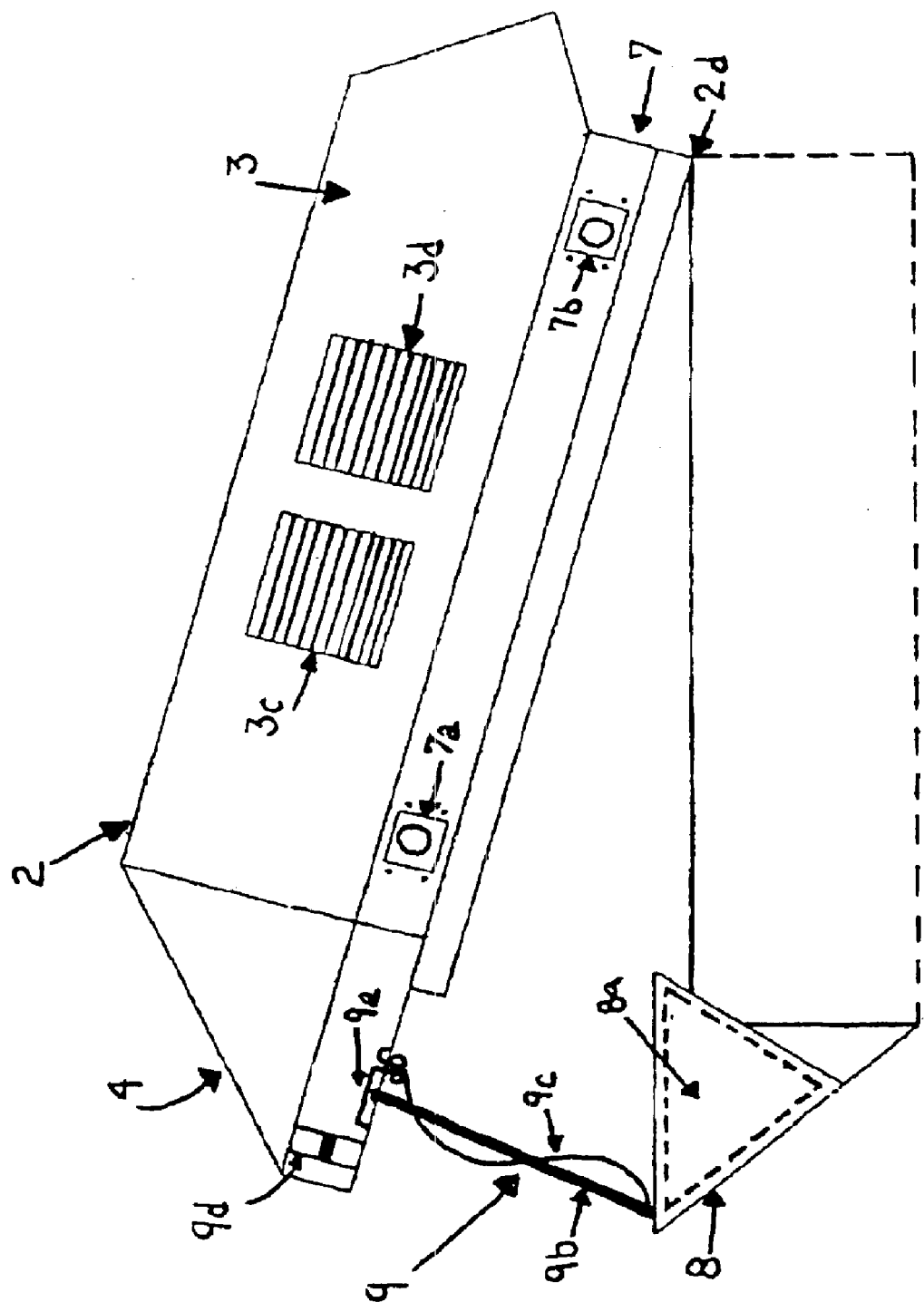
FIG. 3c shows an alternate drive level access position of the platform system of the present invention.

FIG. 3(c) shows a preferred embodiment of the present invention. Upper portion 2 and base 7 are also configured with quick release hinges 2d to allow both upper portion 2 and base 7 to be lifted away from front section 4, and/or removed. This mechanism allows for easy access to all data ports and wiring related to the locomotion including a drive train and power supply of the device. In this configuration, a bottom front portion 8 remains in a stationary position. An interior section 8a of bottom front portion provides a storage area for additional components or the like.

As shown in FIG. 3(c), when both upper portion 2 and base 7 are raised, a support mechanism 9 having a catch 9a and a rod 9b maintains the upper portion and base in the raised position. A safety cable 9c will prevent the upper portion 2 and base 7 from opening too far in the ascending direction before 9a and 9b can be attached. Quick release latching mechanisms 9d (proximate to side 3a) and 9e (proximate to side 3b and not shown) allow for rapidly opening and closing upper portion 2 and base 7.

FIG. 3(d) shows the back portion 5 of the system 1. The back portion 5 includes additional access panels 5a and 5b positioned on upper portion 2. Access panels 5a and 5b are screwed into back portion 5. Alternatively, panels 5a and 5b can be hinged and fastened onto back portion 5 using quick release hinges and fasteners. FIG. 3(d) also shows quick release hinges 2a that allow for upper portion 2 to be raised, as discussed above. FIG. 3(d) also shows quick release hinges 2d which allow upper portion 2 and base 7 to be jointly raised, as discussed above. Back portion 5 also include sonar sensors 5c and 5d as well as a recessed interface panel 5e into which additional apparatus including other robotic mobile units can be connected to pass signal data and power.

Figure 4:
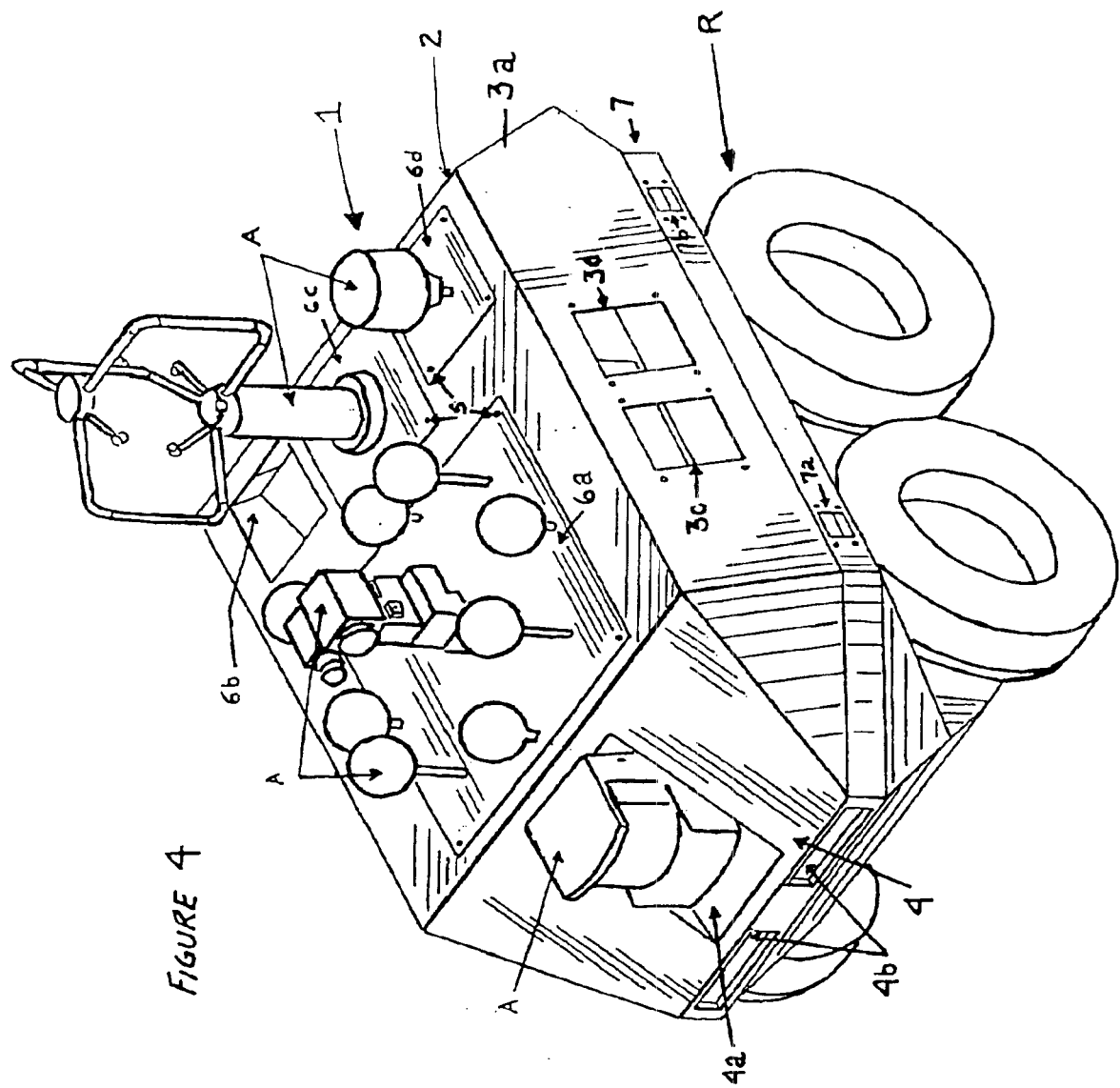
FIG. 4 shows the platform system of the present invention positioned on a robotic vehicle.

FIG. 4 shows a preferred embodiment of the present invention where the platform system 1 is positioned onto and attached to a robotic vehicle, R having a drive train and power supply. First side 3a provides air flow apparatus 3c and 3d (and air flow apparatus 3e and 3f on side 3b, not shown). Front portion 4 includes an aperture 4a into which a scanning laser rangefinder (LADAR) is positioned. Front portion 4 also includes sonic sensors 4b. System 1 also allows for a plurality of apparatus and sensors A to be positioned on plates 6a, 6b, 6c and 6d, as shown. As discussed above, system 1 allows the robotic vehicle R to obtain and transmit data in harsh environments and weather conditions. The platform system 1 provides a water, dust and dirt resistant enclosure mechanism which protects the sensors and apparatus from damage while at the same time providing a mechanism by which individual apparatus/sensor(s), components of the apparatus/sensor(s) including all wiring can be easily accessed, maintained and repaired.

Figure 5:
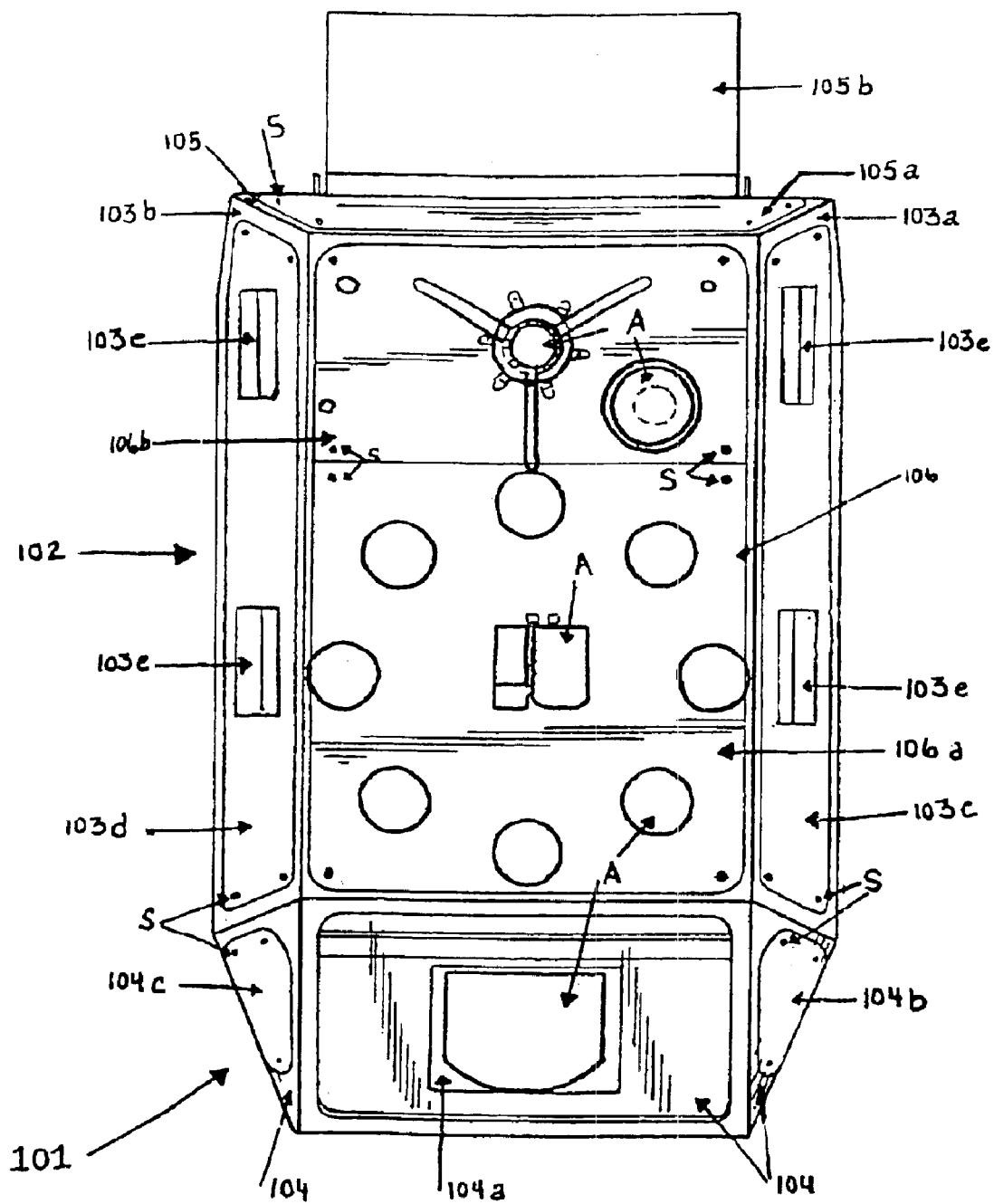
FIG. 5 shows a top view of the alternate embodiment of the platform system of the present invention.

FIG. 5 shows another embodiment of the present invention. As shown, the platform system 101 includes an upper portion 102, a first side 103a, a second side 103b, a front portion 104, and a back portion 105. The upper portion 102 also includes an outer top surface 106.

Outer top surface 106 includes at least two plates 106a and 106b that are attached to the surface 106 via screws S. The plates 106a and 106b are used to hold a plurality of apparatus and sensors A including but not limited to an 8-microphone acoustic array, a visible camera, an infrared camera, a scanning laser rangefinder (LADAR), a point laser rangefinder, 12 sonar sensors, 3 CPUs, 2 wireless LANS, a video transmitter, a GPS sensor, a digital compass, a weather sensor, a stereo camera pair and a driving camera. Additional and/or alternate plates may be added to the top surface 106 depending upon the number and type of apparatus utilized.

Side portion 103a includes a side panel 103c, and side portion 103b includes a side panel 103d. Panels 103c and 103d are attached to their respective panels via screws S. Additionally, panels 103c and 103d may be hinged, utilizing quick release hinges, along the bottom edges (not shown) and fastened using known fastening apparatus. Side panels 103c and 103d, as shown in figure 5, also includes air flow apparatus 103e. Air flow apparatus 103e include filters, fans and vents to provide necessary air flow to prevent components and wiring from overheating (not shown).

Front portion 104 includes an aperture 104a for positioning a LADAR within. Additionally, front portion 104 includes front side panels 104b and 104c which are attached to front portion 104 via screws S. Back portion 105 includes a panel 105a which is attached to back portion 105 via screws S and a back dock 105b. The back dock 105b provides easy access to other robotic apparatus to board and integrate with system 101. Alternatively, the back dock 105b may be replaced with a dispenser for ground sensors, an arm mechanism for retrieving objects, placing objects or performing functions with various arm attachments as will be understood by one of ordinary skill in the art. Alternatively, back dock 105b may be replaced with a spool for tethering in bad radio frequency environments. Additionally, all of the panels/plates 103c, 103d, 104b, 104c, 105a, 106a and 106b are removable from system 101.

Figure 5A:
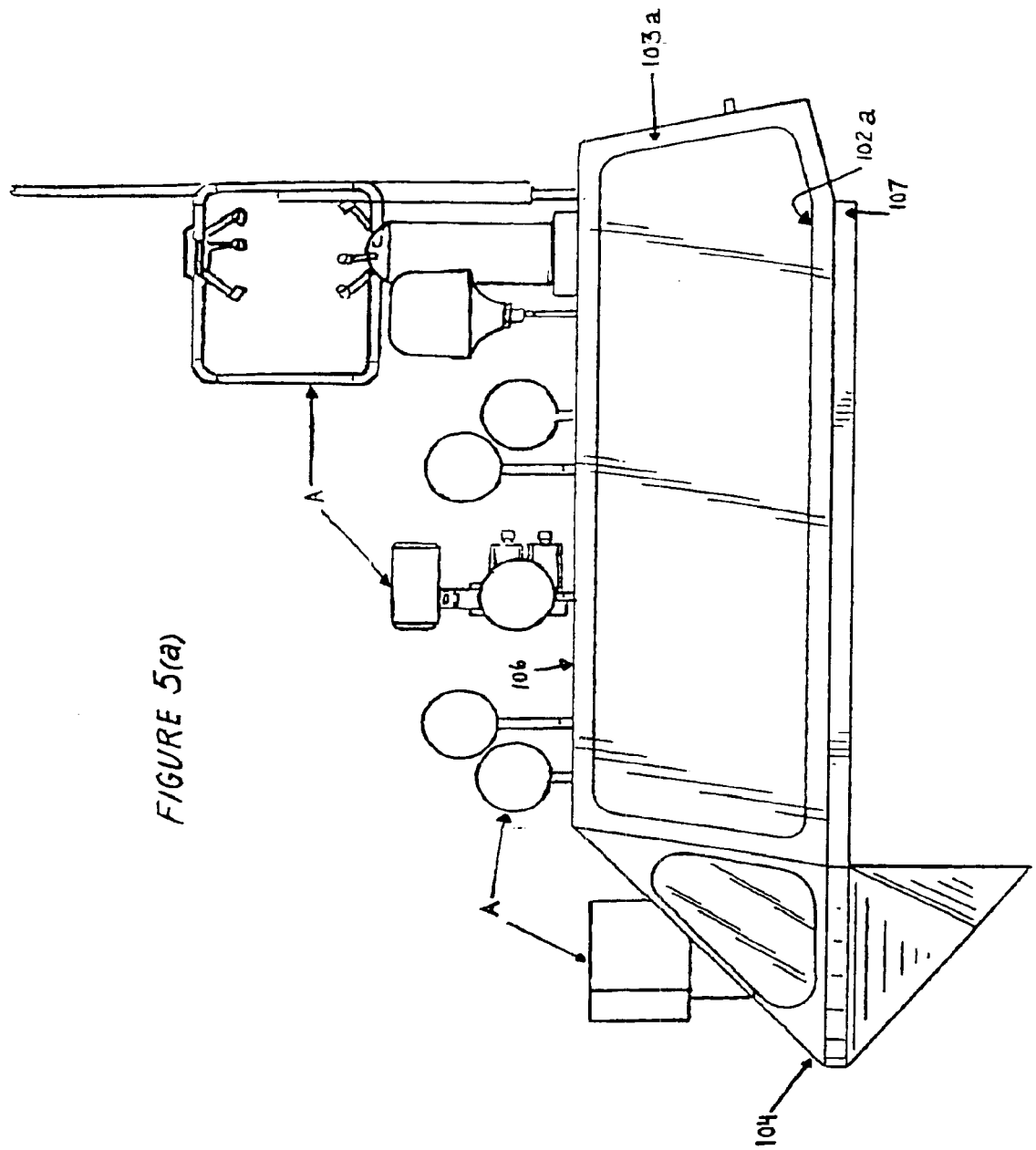
FIG. 5a shows a side view of the alternate embodiment of the platform system of the present invention.

FIG. 5(a) shows the first side portion 103a with side panel 103c, removed to provide a quick and efficient manner to access interior portion 102a. Similarly, FIG. 5(a) shows front side 104 with front side panel 104b removed to provide a quick and efficient manner to access interior portion 102a. Interior portion 102a houses components and wiring for the apparatus and sensors positioned on surface 106.

Similar to system 1, as shown in FIG. 3(b) (and, therefore not shown), interior portion 102a provides a wire housing system that is used to maintain wire integrity between each device and their respective components. The wire housing system effectuates an efficient and rapid manner by which each apparatus' wiring can be easily tracked and identified for rapid maintenance and/or removal. Additionally, the wire housing system also insulates the wiring from sudden jolts and vibrations when the system 101 is in motion. Interior portion 102a also includes a plurality of brackets for holding individual components of the devices positioned on surface 106. The brackets provide additional stability, shock and vibration isolation that prevent sudden jolts and vibration from reaching the components when system 101 is in motion. Note that the positions of the wire housing system and the brackets are dependant upon design and functional parameters as understood by one of ordinary skill in the art.

FIG. 5(b) shows another preferred embodiment of the present invention. Upper portion 102 and base 107 are hinged with quick release hinges 102b to allow both upper portion 102 and base 107 to be lifted. This mechanism allows for easy access to all data ports and wiring related to the robotic devices upon which the system 101 is positioned. In this configuration, front portion 107a remains in a stationary position. An interior section 107b of front portion 107a provides storage areas for component storage or the like.

Figure 5C:
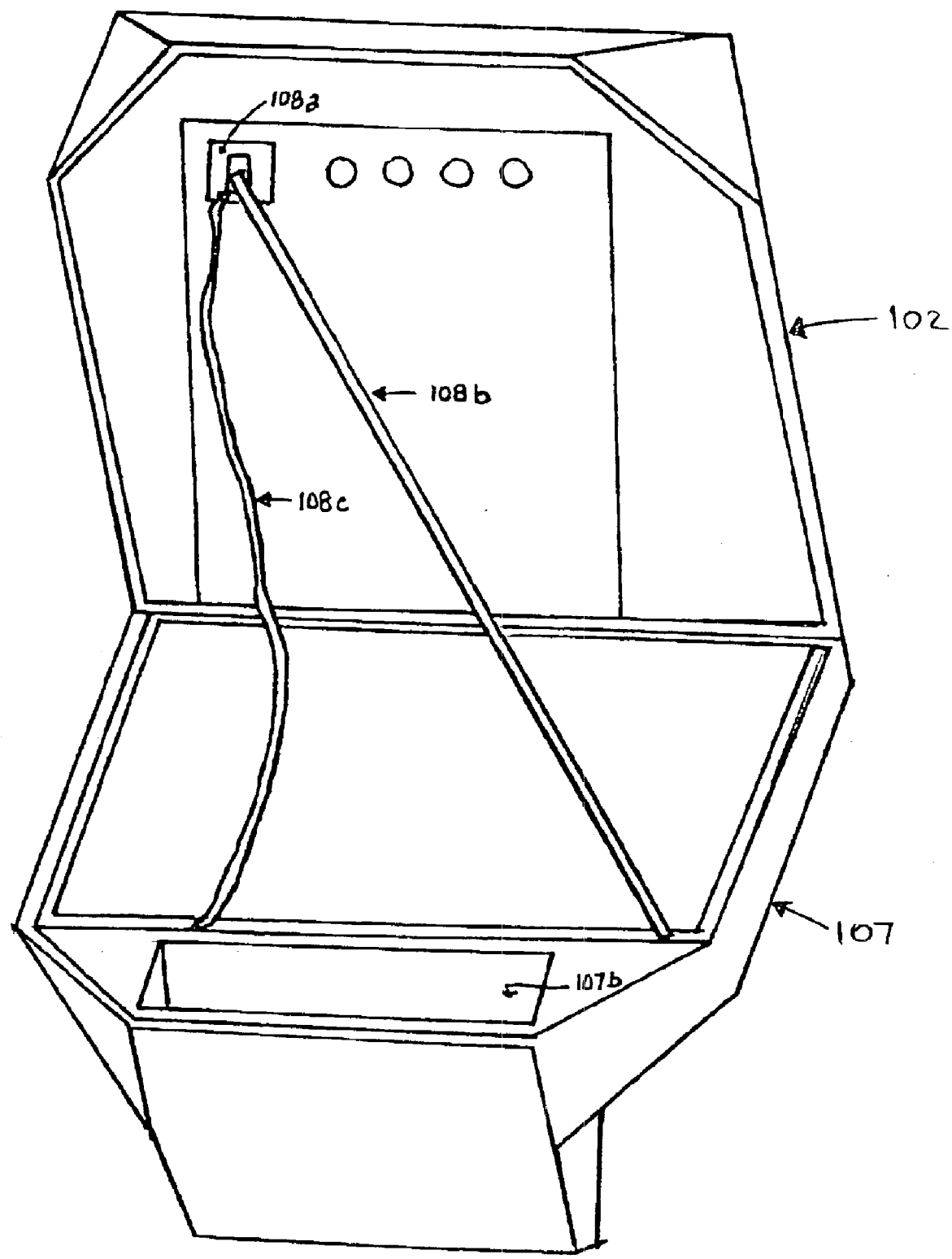
FIG. 5c shows an interior configuration of the alternate embodiment of the platform system of the present invention.

As shown in figure 5(c), when the upper portion 102 and base 107 are raised, a fastener mechanism 108, having a catch 108a and a rod 108b maintains the upper portion 102 and base 107 in the raised position. A safety cable 108c prevents the upper portion 102 and base 107 from opening too far in the ascending direction before catch 108a and rod 109a are attached. Quick release latching mechanisms 109a (proximate to side 103a) and 109b (proximate to side) 103b and not shown allow for rapidly opening and closing upper portion 102 and base 107.

Figure 6:
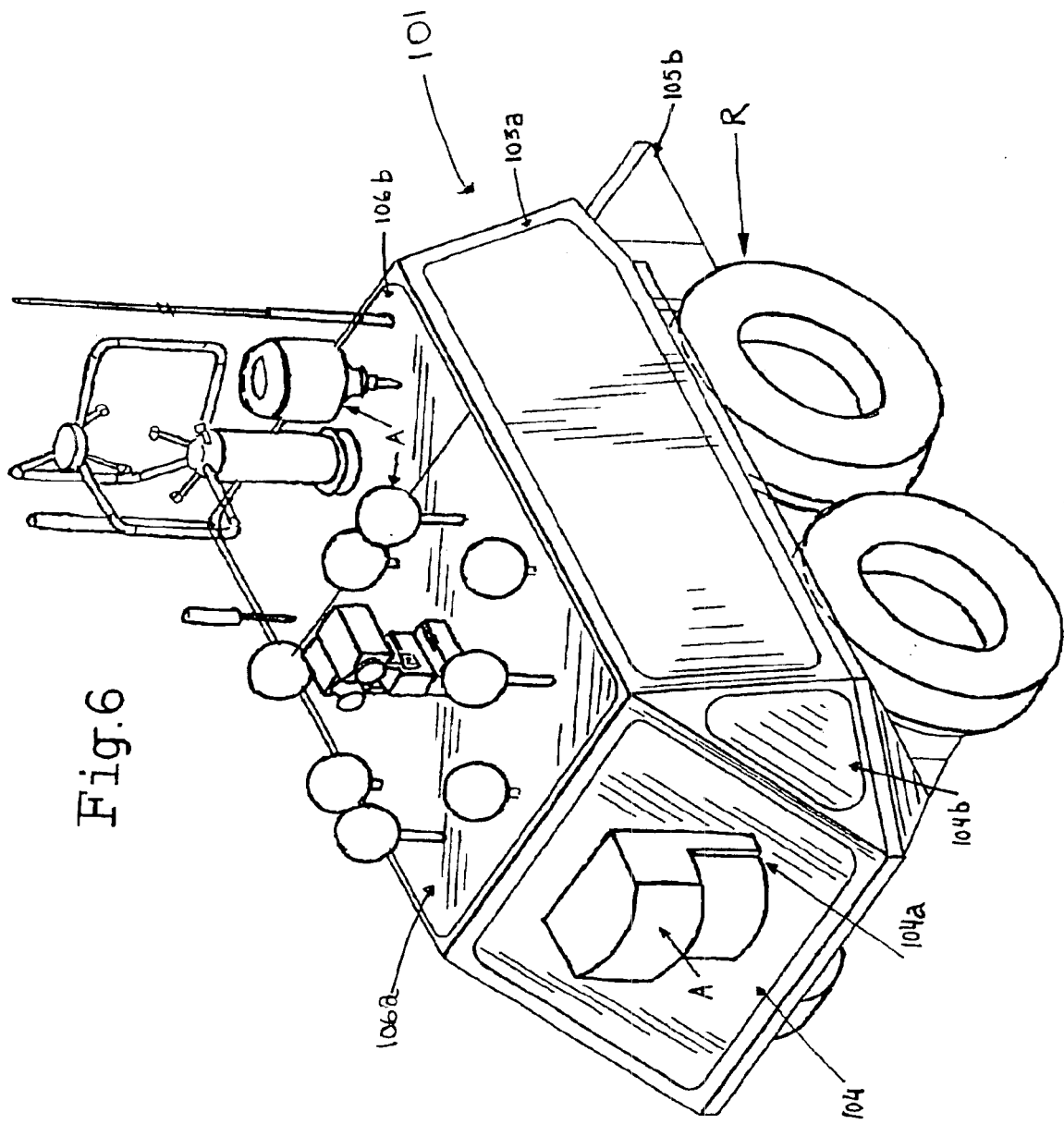
FIG. 6 shows the alternate embodiment of the platform system positioned on a robotic vehicle.

FIG. 6 shows a preferred embodiment of the present invention where the platform system 101 is positioned and attached onto a robotic vehicle, R having a drive train and a power supply. Front portion 104 includes an aperture 104a provides a secure area into which a LADAR can be positioned. Front portion 104 also includes removable front side panel 104b. System 101 provides for a plurality of apparatus and sensors A to be positioned on plates 106a and 106b, as shown. System 101, as discussed above, allows the robotic vehicle R to obtain and transmit data in harsh environments and weather conditions. The platform system 101 provides a water, dust and dirt resistant enclosure mechanism which protects the sensors and apparatus from damage while at the same time providing a mechanism by which individual apparatus/sensor(s), components of the apparatus/sensor(s) including all wiring can be easily accessed, maintained and repaired.

What is claimed is:

1. A system for attaching apparatus and sensor devices comprising:

An upper portion, a first side, a second side, a front portion and a back portion constructed so as to form a platform, wherein said platform is further constructed so as to house a plurality of said apparatus and said sensors, said apparatus and said sensors being further comprised of at least one component part and at least one wire.

2. A system as recited in claim 1, wherein said upper portion further comprises a top surface having a plurality of plates, each of said plates constructed so as to be screwed onto said upper surface.

3. A system as recited in claim 2, wherein said upper portion further comprises at least two quick-release hinges constructed so as to rapidly release said upper portion of said system.

4. A system as recited in claim 3, wherein said first and second side portions comprise at least one air flow apparatus including filters, fans and vents, constructed so as to prevent wire and component overheating.

5. A system as recited in claim 4, wherein said platform further comprises a base portion, wherein said base portion comprises a plurality of sonar sensors.

6. A system as recited in claim 5, wherein said platform further comprises a plurality of quick release upper hinges, said upper hinges constructed so as to allow said upper portion to be lifted away from said front portion and said base portion.

7. A system as recited in claim 6, wherein said platform further comprises a plurality of gas charged lift supports, said lift supports constructed so as to control the rate of ascent and descent of said upper portion, said lift supports further constructed so as to hold said upper portion in an open position and prevent inadvertent closing of said upper portion.

8. A system as recited in claim 7, wherein said upper portion comprises an inner portion, said inner portion constructed so as to house said wires and said components, said inner portion further comprising a wire housing system constructed so as to effectuate wire tracking, maintenance and removal, said wire housing system further constructed so as to prevent said wire from vibration.

9. A system as recited in claim 8, wherein said inner portion further comprises a plurality of brackets, said brackets constructed so as to house said components within said inner portion, said brackets further constructed so as to stabilize said components and prevent vibration of said components.

10. A system as recited in claim 9, wherein said platform comprises a plurality of quick release lower hinges, said hinges constructed so as to allow said upper portion and said base to be lifted away from said front portion.

11. A system as recited in claim 10, wherein said platform further comprises a support mechanism, said support mechanism further comprising a catch, a rod and a safety cable, said support mechanism further constructed so as to maintain said upper portion and said base in a raised position, said safety cable further constructed so as to prevent said upper portion and said base from opening too far.

12. A system as recited in claim 11, wherein said platform further comprises a plurality of quick release latching mechanisms, said latching mechanisms constructed so as to allow said upper portion and base to be rapidly opened.

13. A system as recited in claim 12, wherein said platform further comprises a plurality of back panels positioned on said back portion of said platform, said back panels further constructed so as to provide quick access to said inner portion of said platform.

14. A system as recited in claim 13, wherein said back portion further comprises a plurality of sonar sensors and an interface panel, said interface panel constructed so as to allow apparatus to be connected to said platform.

15. A system for attaching apparatus and sensor devices comprising:

An upper portion, a first side, a second side, a front portion and a back portion constructed so as to form a platform, wherein said platform is further constructed so as to house a plurality of said apparatus and said sensors;

said first and second sides each further comprising a removable panel, said removable panel constructed so as to be removable from said first and second sides, said panels further constructed so as to allow access into an inner portion of said platform;

wherein said inner portion further comprising a wire housing system constructed so as to house wires connected to said apparatus and sensors, said wire housing system further constructed so as to effectuate wire tracking, maintenance and removal of said wires, said wire housing system further constructed so as to prevent said wire from vibration;

wherein said inner portion further comprises a plurality of brackets, said brackets constructed so as to house components connected to said apparatus and sensors within said inner portion, said brackets further constructed so as to stabilize said components and prevent vibration of said components;

wherein said platform further comprises a base, said base constructed so as to connect to said platform, said platform comprising a plurality of quick release hinges, said hinges constructed so as to allow said upper portion and said base to be lifted away from said front portion; and wherein said platform and said base further comprising a support mechanism, said support mechanism comprising a catch, a rod and a safety cable, said support mechanism further constructed so as to maintain said upper portion and said base in a raised position, said safety cable further constructed so as to prevent said upper portion and said base from opening too far.

16. A system as recited in claim 15, wherein said platform further comprises a plurality of quick release latching mechanisms, said latching mechanisms constructed so as to allow said upper portion and base to be rapidly opened.

17. A system as recited in claim 16, said front portion further comprises at least one removable panel positioned on said front portion of said platform, said at least one removable panel further constructed so as to provide quick access to said inner portion of said platform.

18. A system as recited in claim 17, wherein said platform further comprises a plurality of back panels positioned on said back portion of said platform, said back panels further constructed so as to provide quick access to said inner portion of said platform.

19. A system as recited in claim 18, wherein said back portion further comprises a plurality of sonar sensors and an interface panel, said panel constructed so as to allow apparatus to be connected to said platform.

* * * * *